United States Patent [19]
Hayashi et al.

[11] Patent Number: 5,233,256
[45] Date of Patent: Aug. 3, 1993

[54] METHOD OF DRIVING PIEZOELECTRIC BIMORPH DEVICE AND PIEZOELECTRIC BIMORPH DEVICE

[75] Inventors: Seigo Hayashi; Toshihiko Kittaka; Akira Ando, all of Nagaokakyo, Japan

[73] Assignee: Murata Manufacturing Co., Ltd., Japan

[21] Appl. No.: 828,116

[22] Filed: Jan. 30, 1992

[30] Foreign Application Priority Data

Jan. 30, 1991 [JP] Japan .................................. 3-9887

[51] Int. Cl.$^5$ ............................................. H01L 41/08
[52] U.S. Cl. .................................. 310/317; 310/332; 310/366
[58] Field of Search ............... 310/317, 328, 330, 331, 310/332, 366

[56] References Cited

U.S. PATENT DOCUMENTS

| | | | |
|---|---|---|---|
| 4,564,782 | 1/1986 | Ogawa | 310/359 |
| 4,649,313 | 3/1987 | Ogawa et al. | 310/332 |
| 4,742,264 | 5/1988 | Ogawa | 310/332 |
| 4,759,107 | 7/1988 | Ogawa et al. | 310/328 |
| 4,851,871 | 7/1989 | Ooe et al. | 310/317 |
| 4,985,926 | 1/1991 | Foster | 310/366 |
| 5,034,649 | 7/1991 | Chida et al. | 310/332 |
| 5,068,567 | 11/1991 | Jones | 310/332 |
| 5,118,982 | 6/1992 | Inoue et al. | 310/366 |

FOREIGN PATENT DOCUMENTS

| | | | |
|---|---|---|---|
| 223035 | 10/1982 | Japan . | |
| 0041272 | 3/1985 | Japan | 310/330 |
| 0178677 | 9/1985 | Japan | 310/332 |
| 0239682 | 10/1986 | Japan | 310/366 |
| 0216281 | 9/1987 | Japan | 310/317 |
| 0273919 | 11/1989 | U.S.S.R. | 310/330 |

Primary Examiner—Steven L. Stephan
Assistant Examiner—C. LaBalle
Attorney, Agent, or Firm—Ostrolenk, Faber, Gerb & Soffen

[57] ABSTRACT

A method of driving a piezoelectric bimorph device in which first and second piezoelectric ceramic layers are so electrically connected to each other as to expand or contract in the opposite directions, which is characterized in that when $t_1$ is taken as the thickness of one of the first and second piezoelectric ceramic layers, Ec is taken as the coercive field strength of a piezoelectric material constituting the piezoelectric ceramic layer, and $V_1$ is taken as the minimum value of the produce $Ec \times t_1 = Vc_1$, and $t_2$ is taken as the thickness of the other piezoelectric ceramic layer, Ec is taken as the coercive field strength Ec of a piezoelectric material constituting the piezoelectric ceramic layer, and $V_2$ is taken as the minimum value of the produce $Ec \times t_2 = Vc_2$, a voltage of not less than $(V_1 + V_2)$ is applied to said piezoelectric bimorph device.

16 Claims, 12 Drawing Sheets

METHOD OF DRIVING PIEZOELECTRIC BIMORPH DEVICE AND PIEZOELECTRIC BIMORPH DEVICE

BACKGROUND OF THE INVENTION

1. Field of the Invention

The present invention relates generally to a method of driving a piezoelectric bimorph device used as an actuator and a piezoelectric bimorph device, and more particularly, to a driving method for obtaining a large amount of displacement and a piezoelectric bimorph device suitable for the driving method.

2. Description of the Prior Art

FIGS. 2 and 3 are cross sectional views showing one example of a conventional piezoelectric bimorph device.

A piezoelectric bimorph device 1 shown in FIG. 2 has a structure in which piezoelectric ceramic layers 2 and 3 are laminated while being separated by an electrode 4 and electrodes 5 and 6 are formed on the outer major surfaces thereof. The piezoelectric ceramic layers 2 and 3 are subjected to polarization processing in the directions indicated by arrows as shown.

In the case of driving, a voltage $V_0$ is applied between the electrodes 5 and 6, as shown in FIG. 2.

On the other hand, in a piezoelectric bimorph device 7 shown in FIG. 3, piezoelectric ceramic layers 8 and 9 are laminated while being separated by an electrode 10, and electrodes 11 and 12 are formed on the outside thereof. The piezoelectric ceramic layers 8 and 9 are subjected to polarization processing in the same direction, as indicated by arrows as shown. In the case of driving, a voltage $V_0$ is applied between the electrode 10 and the outside electrodes 11 and 12.

The piezoelectric bimorph element 1 shown in FIG. 2 shall be referred to as a piezoelectric bimorph device of a series type because the piezoelectric ceramic layers 2 and 3 are electrically connected in series. On the other hand, the piezoelectric bimorph device 7 shown in FIG. 3 shall be referred to as a piezoelectric bimorph device of a parallel type because the piezoelectric ceramic layers 8 and 9 are electrically connected in parallel.

In obtaining the same amount of displacement, a driving voltage in the piezoelectric bimorph device 7 of a parallel type may be one-half that in the piezoelectric bimorph device 1 of a series type. Consequently, the piezoelectric bimorph device 7 of a parallel type has been conventionally used most commonly.

Meanwhile, in the above described piezoelectric bimorph device, it has been known that when a voltage exceeding the coercive field strength of a piezoelectric body used is applied, the direction of polarization in one of the two piezoelectric ceramic layers is reversed, so that the piezoelectric bimorph device is not bent.

The foregoing will be described more specifically. Let t be the total thickness and let Ec be the coercive field strength in the piezoelectric bimorph devices 1 and 7. In this case, in the piezoelectric bimorph device 1, it has been considered that when a voltage exceeding $Ec \times t$ is applied, the direction of polarization of the piezoelectric ceramic layer 2 subjected to polarization processing in the opposite direction to the direction in which the voltage is applied is reversed, so that the piezoelectric bimorph device 1 cannot be driven. Consequently, the piezoelectric bimorph device 1 has been conventionally used by applying a voltage of not more than the above described voltage $Ec \times t$, so that a large amount of displacement cannot be obtained.

On the other hand, also in the piezoelectric bimorph device 7 shown in FIG. 3, it has been experimentally verified that when a voltage exceeding $Ec \times (t/2)$ is applied, the direction of polarization is reversed, so that the piezoelectric bimorph device 7 is not driven.

SUMMARY OF THE INVENTION

An object of the present invention is to provide a method of driving a piezoelectric bimorph device capable of achieving a larger amount of displacement and a piezoelectric bimorph device having a structure in which such a large amount of displacement can be achieved.

In accordance with a wide aspect, the present invention provides a method of driving a piezoelectric bimorph device comprising first and second piezoelectric bodies laminated directly or indirectly, each of the above first and second piezoelectric bodies comprising one piezoelectric layer or a laminated piezoelectric layer obtained by laminating not less than two piezoelectric layers so subjected to polarization processing and electrically connected to each other as to expand or contract in the same direction, and the above first and second piezoelectric bodies being so electrically connected in series as to expand or contract in the opposite directions, which is characterized in that when in the piezoelectric layer contained in one of the first and second piezoelectric bodies, $t_1$ is taken as the thickness of the piezoelectric layer, Ec is taken as the coercive field strength of a piezoelectric material constituting the piezoelectric layer, and $V_1$ is taken as the minimum value of the product $Ec \times t_1 = Vc_1$ and when in the piezoelectric layer contained in the other piezoelectric body, $t_2$ is taken as the thickness of the piezoelectric layer, Ec is taken as the coercive field strength of a piezoelectric material constituting the piezoelectric layer, and $V_2$ is taken as the minimum value of the product $Ec \times t_2 = Vc_2$, a voltage of not less than $(V_1 + V_2)$ is applied to the above piezoelectric bimorph device.

Furthermore, in accordance with a particular aspect, the present invention provides a piezoelectric bimorph device comprising first and second piezoelectric bodies laminated directly or indirectly, which is characterized by being so constructed that one of the above first and second piezoelectric bodies comprises one piezoelectric layer or a laminated piezoelectric layer obtained by laminating not less than two piezoelectric layers and the other thereof comprises a laminated piezoelectric layer obtained by laminating not less than two piezoelectric layers, and a plurality of piezoelectric layers in each of the laminated piezoelectric layers are so subjected to polarization processing and electrically connected to each other as to expand or contract in the same direction, and the above first and second piezoelectric bodies are electrically connected in series, so that the piezoelectric bimorph device is so driven that the first and second piezoelectric bodies expand or contract in the opposite directions.

Detailed Description of the Invention

The present invention relates to a piezoelectric bimorph device 1 of a series type shown in FIG. 2 and a method of driving a piezoelectric bimorph device of a series type shown in the embodiments as described later. The basic principle of the present invention will be described by taking as an example a method of driving the piezoelectric bimorph device 1 shown in FIG. 2.

The piezoelectric bimorph device 1 corresponds to a structure in which two capacitors are connected in series on an electric circuit basis. Consequently, when a voltage is applied between electrodes 5 and 6, charges induced on the electrodes 5 and 6 shown in FIG. 2 are opposite in sign and are equal in absolute value.

The electrical properties of piezoelectric ceramic layers 2 and 3 acting as piezoelectric bodies constituting the above described piezoelectric bimorph device 1 will be paid attention to. FIG. 1 shows the relation between a typical electric field E and charge Q in the piezoelectric body. Generally piezoelectric ceramics exhibits hysteresis shown in FIG. 1 in the relation between the electric field E and the charge Q, which is a characteristic features of ferroelectrics. Consequently, when a positive potential is applied to the electrode 5, for example, an electric field in the opposite direction to the direction of polarization is applied to the piezoelectric ceramic layer 2, so that a charge $\Delta Q_B$ is induced therein along a curve RB shown in FIG. 1. On the other hand, a charge $\Delta Q_A$ is induced in the piezoelectric ceramic layer 3 along a curve RA.

In the driving method according to the present invention, the relation (absolute value of $\Delta Q_A$)=(absolute value of $\Delta Q_B$) always holds, as described above. Consequently, when $E_B$ is taken as the strength of an electric field applied to the piezoelectric ceramic layer 2 and $E_A$ is taken as the strength of an electric field applied to the piezoelectric ceramic layer 3, it is found that the relation $E_A > E_B$ holds from the hysteresis shown in FIG. 1.

More specifically, an electric field applied is distributed in a large range on the side of the piezoelectric ceramic layer 3 in which the direction of polarization and the direction of the electric field applied coincide with each other, while being distributed in a small range on the side of the piezoelectric ceramic layer 2 in which the direction of polarization and the direction of the electric field are opposite to each other.

In the piezoelectric bimorph device 1 of a series type shown in FIG. 2, it has been conventionally considered that when t is taken as the total thickness of the piezoelectric bimorph device 1 and $E_C$ is taken as the coercive field strength, the direction of polarization is reversed if a voltage exceeding $Ec \times t = V_C$ is applied. Actually, however, a electric filed applied is distributed in a small range on the side of the piezoelectric ceramic layer 2 when $V_0 > 0$, while being distributed in a small range on the side of the piezoelectric ceramic layer 3 when $V_O < 0$, as described above.

Consequently, it is found that even if the above described voltage exceeding $Ec \times t$ is applied, the direction of polarization is not reversed until an electric field exceeding Ec is actually applied to the piezoelectric ceramic layer 2 itself when $V_0 > 0$. In the present invention, therefore, the voltage exceeding $Ec \times t$ is positively applied in consideration of the fact that the direction of polarization is not immediately reversed even if the piezoelectric bimorph device 1 is driven by applying the voltage exceeding $Ec \times t$, thereby to make it possible to obtain a large amount of displacement which has not been conventionally obtained.

Meanwhile, the maximum applied voltage and the maximum amount of displacement are dependent on the shape of hysteresis of an electric field-electric flux density, which can be both theoretically set to arbitrary values by controlling the ratio of gradients of the hysteresis in positive and negative regions of the electric filed.

A driving method according to the present invention utilizes the above described basic principle. The piezoelectric bimorph device is driven as follows because it has the above described particular structure. More specifically, when $t_1$ is taken as the thickness of the piezoelectric layer contained in one of the piezoelectric bodies, Ec is taken as the coercive field strength of a piezoelectric material constituting the piezoelectric layer, and $V_1$ is taken as the minimum value of the product $Ec \times t_1 = Vc_1$ and $V_2$ is taken as the minimum value of the product of the coercive field strength and the thickness found in the same manner in the piezoelectric layer contained in the other piezoelectric body, a voltage of not less than $(V_1 + V_2)$ is applied to the piezoelectric bimorph device.

More specifically, the present invention has been made so as to obtain a larger amount of displacement by applying a larger electric field to drive a piezoelectric bimorph device in view of the fact that an electric field applied is distributed in a small range when the electric filed is applied in the opposite direction to the direction of polarization.

Furthermore, in accordance with another aspect of the present invention, there is provided a piezoelectric bimorph device applied to the above described driving method. In this piezoelectric bimorph device, first and second piezoelectric bodies are laminated directly or indirectly. The expression "laminated indirectly" is used for meaning that a plate-shaped member such as a metal plate or an insulating ceramic layer may be interposed between the first and second piezoelectric bodies.

The piezoelectric bimorph device according to the present invention is so constructed that the first and second piezoelectric bodies are electrically connected in series, so that the piezoelectric bimorph device is so driven that the first and second piezoelectric bodies expand or contract in the opposite directions to operate as a bimorph. Consequently, the piezoelectric bimorph device can be driven in accordance with the above described driving method according to the present invention, thereby to make it possible to obtain a large amount of displacement which cannot be conventionally obtained.

As described in the foregoing, in the driving method according to the present invention, it is possible to achieve a very large amount of displacement which cannot be obtained in the conventional method of driving a piezoelectric bimorph device. Consequently, it is possible to provide an actuator most suitable for the use for a shutter of a camera, a relay and the like.

Furthermore, a voltage applied to a piezoelectric layer to which an electric field in the opposite direction to the direction of polarization is applied can be made smaller than the conventional one, thereby to make it possible to obtain a piezoelectric bimorph device superior in stability with time and reliability.

Additionally, in the piezoelectric bimorph device according to the present invention, it is possible to obtain the same amount of displacement at the same voltage or a lower voltage, as compared with a monolithic piezoelectric bimorph device of a parallel type by changing the number of piezoelectric layers. Moreover, a large amount of displacement is obtained if the driving method according to the present invention is used.

The foregoing and other objects, features, aspects and advantages of the present invention will becomes more apparent from the following detailed description of the present invention when taken in conjunction with the accompanying drawings.

DESCRIPTION OF THE PREFERRED EMBODIMENTS

First Embodiment

Figure 1:
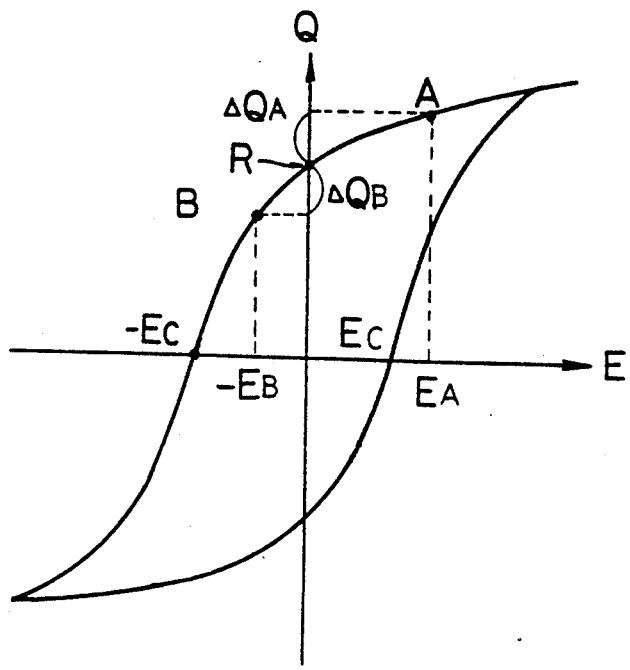
FIG. 1 is a diagram showing the relation between the amount of displacement and an applied voltage for explaining the principle of the present invention.
Figure 2:
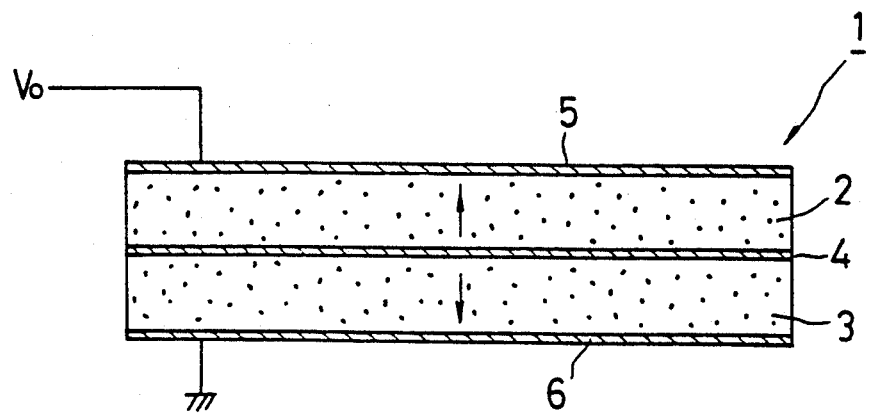
FIG. 2 is a cross sectional view showing a piezoelectric bimorph device used in the first embodiment.

Referring to FIG. 2, description is made of a driving method according to a first embodiment of the present invention.

Two single plates made of piezoelectric ceramics of a $Pb(Zr, Ti)O_3$ system having a thickness of 0.2 mm are first prepared. Conductive pastes are applied to both major surfaces of each of the single plates, and the same voltage is applied in the direction of thickness, to subject the single plate to polarization processing. The above two single plates are then bonded and fixed to each other such that they are opposite in the direction of polarization, thereby to obtain a piezoelectric bimorph device 1 shown in FIG. 2. The piezoelectric bimorph device 1 prepared is 0.4 mm in total thickness, 20 mm in effective length and 5 mm in width.

Figure 3:
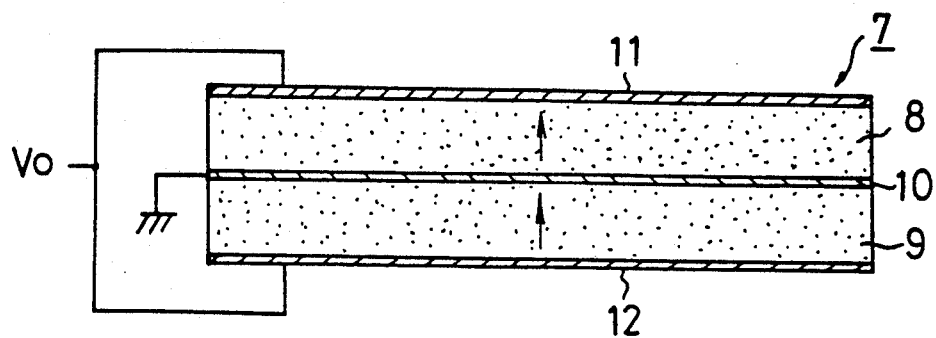
FIG. 3 is a cross sectional view for explaining a method of driving a conventional piezoelectric bimorph device.

Furthermore, for comparison, a piezoelectric bimorph device 7 of a parallel type shown in FIG. 3 is constructed using single plates made of the same piezoelectric ceramics as the foregoing. More specifically, the two single plates made of piezoelectric ceramics are bonded and fixed to each other such that they are equal in the direction of polarization, contrary to a case where the piezoelectric bimorph device 1 is prepared, to fabricate a piezoelectric bimorph device 7 of the same size as the piezoelectric bimorph device 1.

The above described piezoelectric bimorph device 1 and piezoelectric bimorph device 7 are then driven by applying a voltage as shown. In this case, the relations between the respective amounts of displacement of the piezoelectric bimorph devices 1 and 7 and the applied voltage are respectively indicated by a solid line and a one-dot and dash line in FIG. 7.

Figure 7:
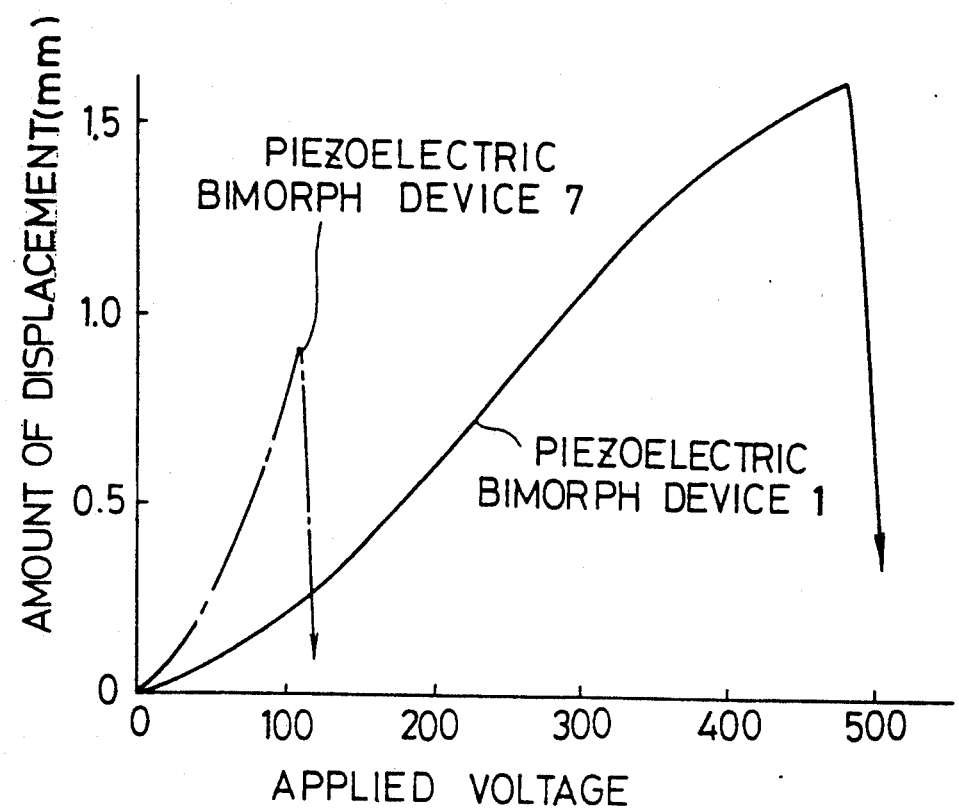
FIG. 7 is a diagram showing the relations between the amount of displacement and an applied voltage in the embodiment and the conventional example.

As can be seen from FIG. 7, the amount of displacement which is approximately two times that in the piezoelectric bimorph device 7 of a parallel type is obtained in the piezoelectric bimorph device 1 of a series type. That is, a very large voltage can be applied in the piezoelectric bimorph device 1, thereby to obtain a larger amount of displacement.

Furthermore, the following table 1 shows the relation between a voltage applied to the total thickness of the piezoelectric bimorph device 1 in driving the piezoelectric bimorph device 1 and voltages applied to the piezoelectric ceramic layers 2 and 3 in the case.

| voltage applied to total thickness (V) | voltage applied to layer in which directions of polarization and electric field coincide (V) | voltage applied to layer in which directions of polarization and electric field are opposite (V) |
| --- | --- | --- |
| 100 | 79 | 21 |
| 200 | 153 | 47 |
| 300 | 226 | 74 |
| 400 | 298 | 102 |

As can be seen from Table 1, a large voltage is applied to the piezoelectric ceramic layer 3 in which the directions of polarization and an electric field coincide with each other, while only a small voltage is applied to the piezoelectric ceramic layer 2 in which the directions of polarization and an electric field are opposite to each other. More specifically, the ratio of the voltages applied to the piezoelectric ceramic layers 2 and 3 is approximately 1:3. Consequently, it is found that a voltage which is one-fourth a voltage applied to the total thickness is only distributed on the side of the piezoelectric ceramic layer 2 in which the directions of polarization and an electric field are opposite to each other.

Figure 4:
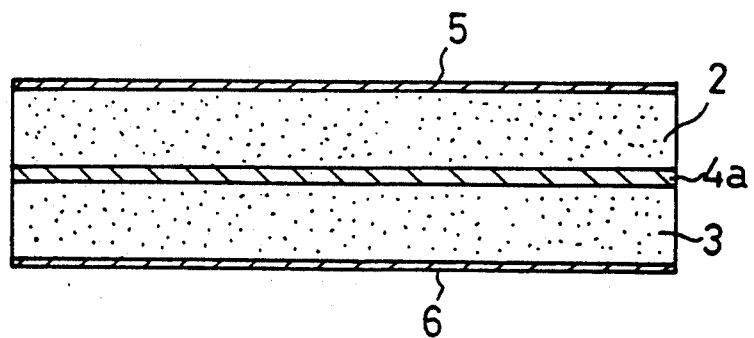
FIG. 4 is a cross sectional view showing a modified example of a piezoelectric bimorph device used in a driving method according to the first embodiment.

Accordingly, a voltage which is approximately two times $Ec \times t$ at which it has been considered that the direction of polarization is reversed can be applied to the total thickness t of the piezoelectric bimorph device 1. Consequently, it is found that the amount of displacement which is approximately two times that in the conventional method of driving a piezoelectric bimorph device is obtained. The piezoelectric bimorph device to which the driving method according to the present invention is applied is not limited to one shown in FIG. 2. For example, it may be a piezoelectric bimorph device having a structure in which piezoelectric ceramic layers 2 and 3 are affixed to each other while being separated by a metal plate 4a made of a metal material such as a Sim material, as shown in a cross sectional view of FIG. 4. That is, it may be a piezoelectric bimorph device in which piezoelectric ceramic layers 2 and 3 are indirectly laminated while being separated by a metal plate 4a made of a Sim material. Also in this case, the piezoelectric bimorph device is driven in accordance with the above described driving method according to the first embodiment, thereby to make it possible to achieve a larger amount of displacement, as compared with the conventional method of driving a piezoelectric bimorph device.

Second Embodiment

Figure 5:
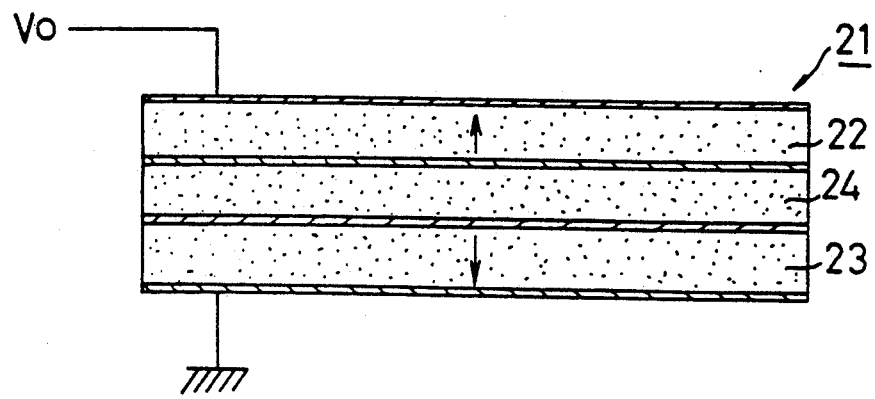
FIG. 5 is a cross sectional view showing a modified example of a piezoelectric bimorph device used in a driving method according to a second embodiment.

FIG. 5 is a cross sectional view showing a piezoelectric bimorph device 21 driven by a driving method according to a second embodiment of the present invention.

Three single plates made of piezoelectric ceramics of the same size are first prepared. Conductive pastes for electrodes are applied to both major surfaces of each of the three single plates and then, the same voltage is applied to two of the three single plates in the direction of thickness to subject the two single plates to polarization processing. The two single plates made of piezoelectric ceramics which are subjected to polarization processing are bonded and fixed to both sides of the single plate made of piezoelectric ceramics which is not subjected to polarization processing, to obtain a piezoelectric bimorph device shown in FIG. 5.

In FIG. 5, reference numerals 22 and 23 denote piezoelectric ceramic layers subjected to polarization processing, which are respectively constituted by the above described single plates made of piezoelectric ceramics which are subjected to polarization processing. On the other hand, reference numeral 24 denotes a ceramic layer, which is constituted by the single plate which is not subjected to polarization processing. The piezoelectric ceramic layers 22 and 23 are so subjected to polarization processing as to be opposite to each other in the direction of polarization. This piezoelectric bimorph device 21 is driven by the electrical connection as shown in FIG. 5. That is, the piezoelectric bimorph device 21 is driven as the above described piezoelectric bimorph device of a series type.

Figure 6:
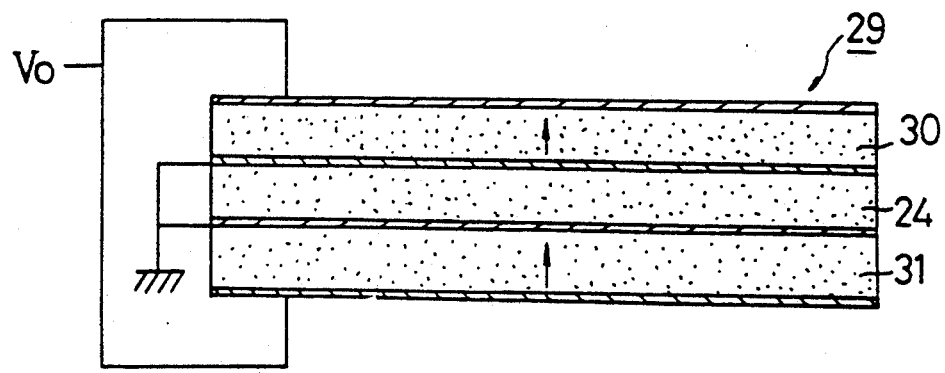
FIG. 6 is a cross sectional view for explaining a method of driving a piezoelectric bimorph device of a parallel type as a comparative example.

For comparison, a piezoelectric bimorph device 29 shown in FIG. 6 is fabricated in the same manner as the piezoelectric bimorph device 21. The piezoelectric bimorph device 29 differs from the piezoelectric bimorph device 21 in that the directions of polarization of piezoelectric ceramic layers 30 and 31 are equal to each other. In addition, the piezoelectric bimorph device 29 is driven as the above described piezoelectric bimorph device of a parallel type by the electrical connection as shown in FIG. 6.

Figure 8:
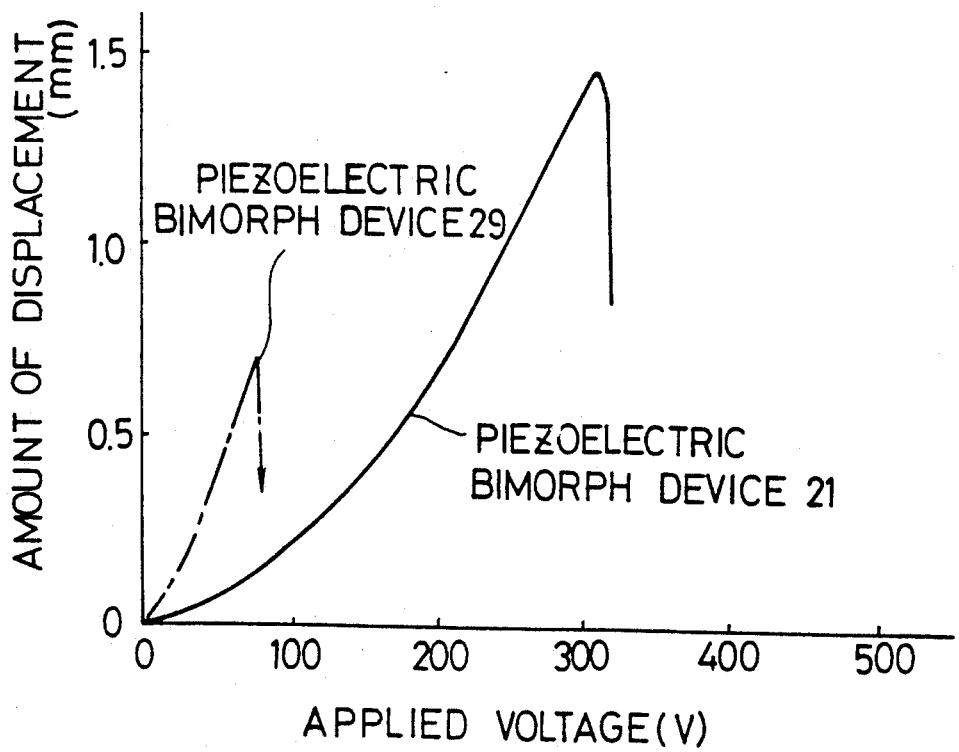
FIG. 8 is a diagram showing the relations between an applied voltage and the amount of displacement in the embodiment and the conventional example.

FIG. 8 shows the relations between the applied voltage and the respective amounts of displacement in cases where the piezoelectric bimorph devices 21 and 29 are driven. The characteristics shown in FIG. 8 are the same as those in the first embodiment except that the thickness of each of the piezoelectric ceramic layers 22, 23, 30 and 31 and the ceramic layer 24 is 0.13 mm such that the piezoelectric bimorph devices 21 and 29 are 0.4 mm in total thickness.

As can be seen from FIG. 8, when the piezoelectric bimorph device 21 of a series type is driven, the applied voltage can be made large, as indicated by a solid line, thereby to make it possible to achieve the amount of displacement which is not less than two times that in the case of the piezoelectric bimorph device 29 of a parallel type. More specifically, as can be seen from FIG. 8, in the piezoelectric bimorph device 21 of a series type, a voltage which is approximately two times $Ec \times 2t/3$ at which it has been considered that the direction of polarization is reversed can be applied to the total thickness t, thereby to make it possible to obtain the amount of displacement which is two times that in the case of the piezoelectric bimorph device 29 of a parallel type.

Third Embodiment

A piezoelectric bimorph device having the same structure as that of the piezoelectric bimorph device 1 used in the first embodiment.

The piezoelectric bimorph device differs from the piezoelectric bimorph device 1 in that a conductive paste for an electrode is applied to one major surface of each of two single plates made of piezoelectric ceramics prepared and the process of applying a conductive paste for an electrode on the other major surface is omitted in place of applying conductive pastes for electrodes to both major surfaces of each of the two single plates made of piezoelectric ceramics. The single plate is subjected to polarization processing by pressing against conductive rubber the major surface to which no conductive paste is applied.

The respective major surfaces, on which no pastes for electrodes are formed, of the two single plates made of piezoelectric ceramics thus subjected to polarization processing are bonded to each other such that the single plates are opposite in the direction of polarization, thereby to fabricate a piezoelectric bimorph device having a structure in which the inner electrode 4 is removed from the piezoelectric bimorph device 1.

A voltage is applied to a piezoelectric bimorph device thus obtained by the same electrical connection as the piezoelectric bimorph device 1 shown in FIG. 2. Consequently, it is confirmed that the same relation as the relation between the applied voltage and the amount of displacement in the piezoelectric bimorph device 1 in the first embodiment (the relation shown in FIG. 7) is obtained.

Consequently, it is found that the method of driving the piezoelectric bimorph device according to the present invention is generally applicable to a piezoelectric bimorph device constructed by laminating first and second piezoelectric bodies which are opposite in the direction of polarization irrespective of the presence or absence of an inner electrode.

Embodiment of monolithic piezoelectric bimorph device having not less than three piezoelectric layers A monolithic piezoelectric bimorph device having not less than three piezoelectric ceramic layers acting as piezoelectric layers has been conventionally known. This type of monolithic piezoelectric bimorph device conventionally used is shown in FIGS. 9 and 10.

Figure 9:
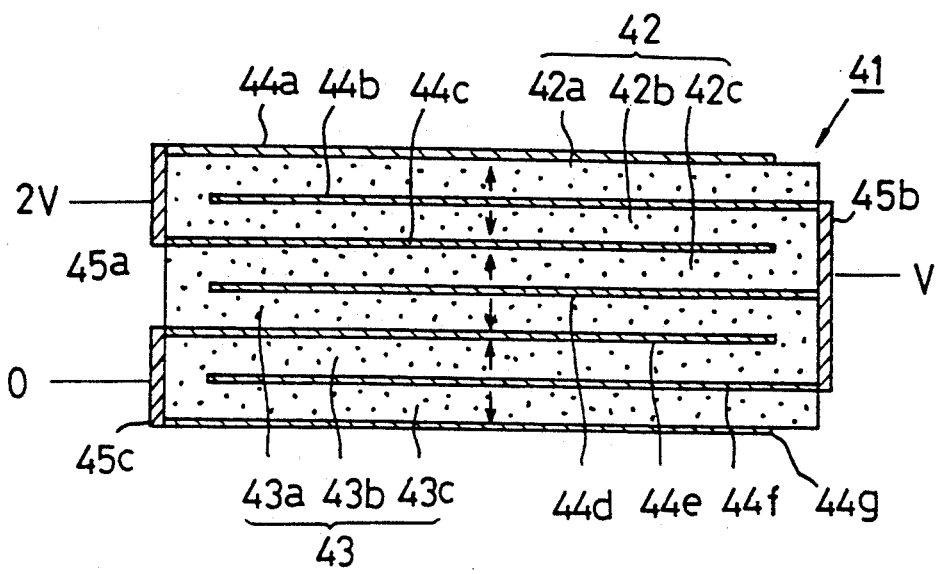
FIG. 9 is a schematic cross sectional view showing a conventional three-terminal type piezoelectric bimorph device.
Figure 10:
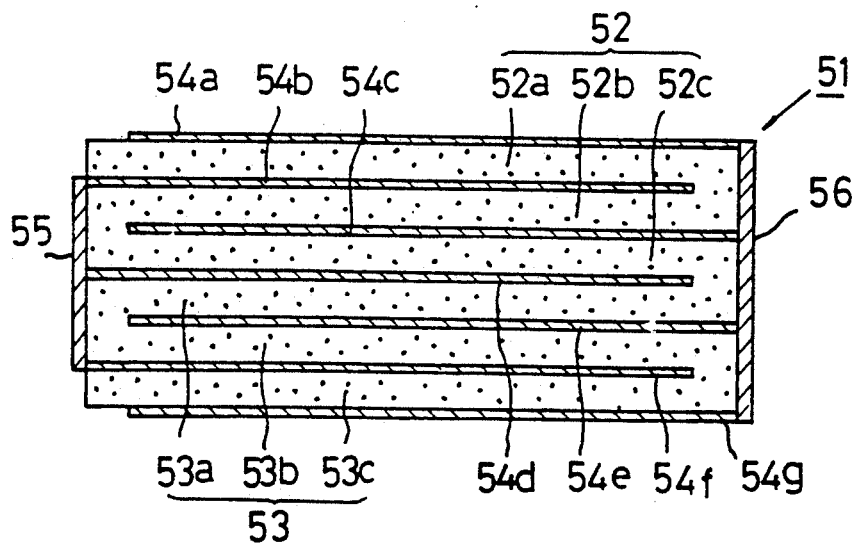
FIG. 10 is a schematic cross sectional view showing a conventional piezoelectric bimorph device of a parallel type.

A piezoelectric bimorph device 41 shown in FIG. 9 has a structure in which a first piezoelectric body 42 comprising piezoelectric ceramic layers 42a to 42c and a second piezoelectric body 43 comprising piezoelectric ceramic layers 43a to 43c acting as piezoelectric layers are laminated.

In order to apply an electric field to each of the piezoelectric ceramic layers 42a to 42c and 43a to 43c, electrodes 44a to 44g are arranged so as to be overlapped with each other while being separated by the piezoelectric ceramic layers.

In driving the piezoelectric bimorph device 41, the first piezoelectric body 42 and the second piezoelectric body 43 expand or contract in the opposite directions by providing terminal electrodes 45a, 54b and 45c as shown and respectively applying potentials of 2 V, 1 V and 0 to the terminal electrodes. The monolithic piezoelectric bimorph device 41 of this type is referred to as a three-terminal type piezoelectric bimorph device.

FIG. 10 is a schematic diagram showing another example of the monolithic piezoelectric bimorph device conventionally used. This piezoelectric bimorph device 51 belongs to the above described piezoelectric bimorph device of a parallel type and has a first piezoelectric body 52 comprising piezoelectric ceramic layers 52a to 52c acting as piezoelectric layers and a second piezoelectric body 53 comprising piezoelectric ceramic layers 53a to 53c. In order to apply an electric field to each of the piezoelectric ceramic layers 52a to 52c and 53a to 53c, electrodes 54a to 54g are provided so as to be overlapped with each other while being separated by the piezoelectric ceramic layers, and terminal electrodes 55 and 56 are provided to both end surfaces of a laminated body.

In driving the piezoelectric bimorph device 51, the first piezoelectric body 52 and the second piezoelectric body 53 expand or contract in the opposite directions by alternately applying voltages which are opposite in polarity from the terminal electrodes 55 and 56, so that the piezoelectric bimorph device 51 is operated as a bimorph.

In the above described piezoelectric bimorph device 51 of a parallel type, the first and second piezoelectric bodies 52 and 53 respectively comprise a plurality of piezoelectric ceramic layers 52a to 52c and 53a to 53c. Accordingly, a large amount of displacement is obtained at a low voltage. However, it is demanded that a larger amount of displacement can be achieved. In addition, the three-terminal type piezoelectric bimorph device 41 shown in FIG. 9 is not very often used because a voltage required to obtain the same amount of displacement is large, i.e., two times that in the piezoelectric bimorph device 51 of a parallel type and the maximum amount of displacement obtained is the same as that therein.

Figure 11:
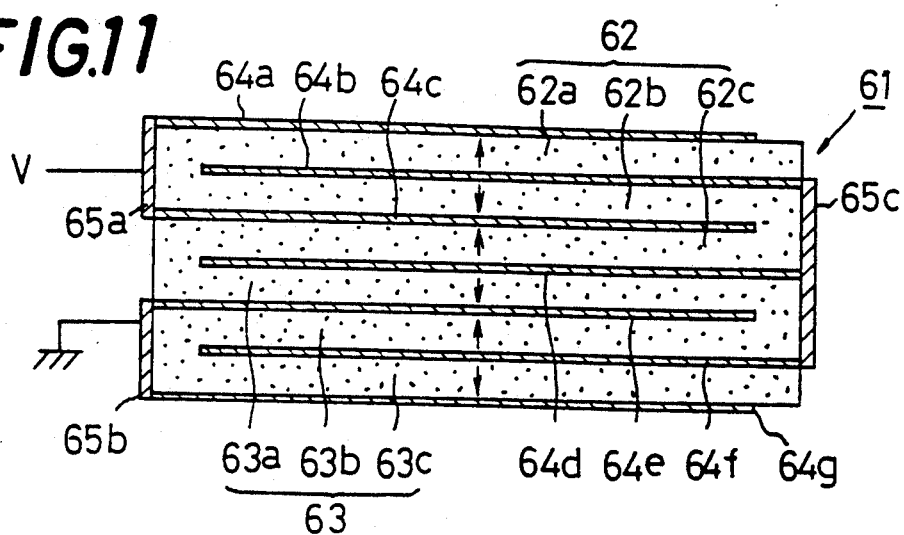
FIG. 11 is a schematic cross sectional view showing a monolithic piezoelectric bimorph device according to an embodiment of the piezoelectric bimorph device according to the present invention.

FIG. 11 is a diagram schematically showing a piezoelectric bimorph device 61 according to one embodiment of the present invention. This piezoelectric bimorph device 61 belongs to a piezoelectric bimorph device of a series type according to the above described classification. A significantly larger amount of displacement than those in the conventional monolithic piezoelectric bimorph device 51 of a parallel type and three-terminal type piezoelectric bimorph device 41 can be achieved in the piezoelectric bimorph device 61, as obvious from the following description.

The piezoelectric bimorph device 61 has a structure in which a first piezoelectric body 62 comprising piezoelectric ceramic layers 62a to 62c acting as piezoelectric layers and a second piezoelectric body 63 comprising piezoelectric ceramic layers 63a to 63c are laminated. In order to apply an electric field to each of the piezoelectric ceramic layers 62a to 62c and 63a to 63c, electrodes 64a to 64g are formed so as to be overlapped with each other. In order to further apply a voltage, terminal electrodes 65a, 65b and 65c are formed on end surfaces of a laminated body, as shown in FIG. 11.

In driving the piezoelectric bimorph device 61, a voltage is applied between the terminal electrodes 65a and 65b, as shown in FIG. 11. The first piezoelectric body 62 and the second piezoelectric body 63 expand or contract in the opposite directions by alternating reversing the polarity of the applied voltage, so that the piezoelectric bimorph device 61 is operated as a bimorph.

Figure 12:
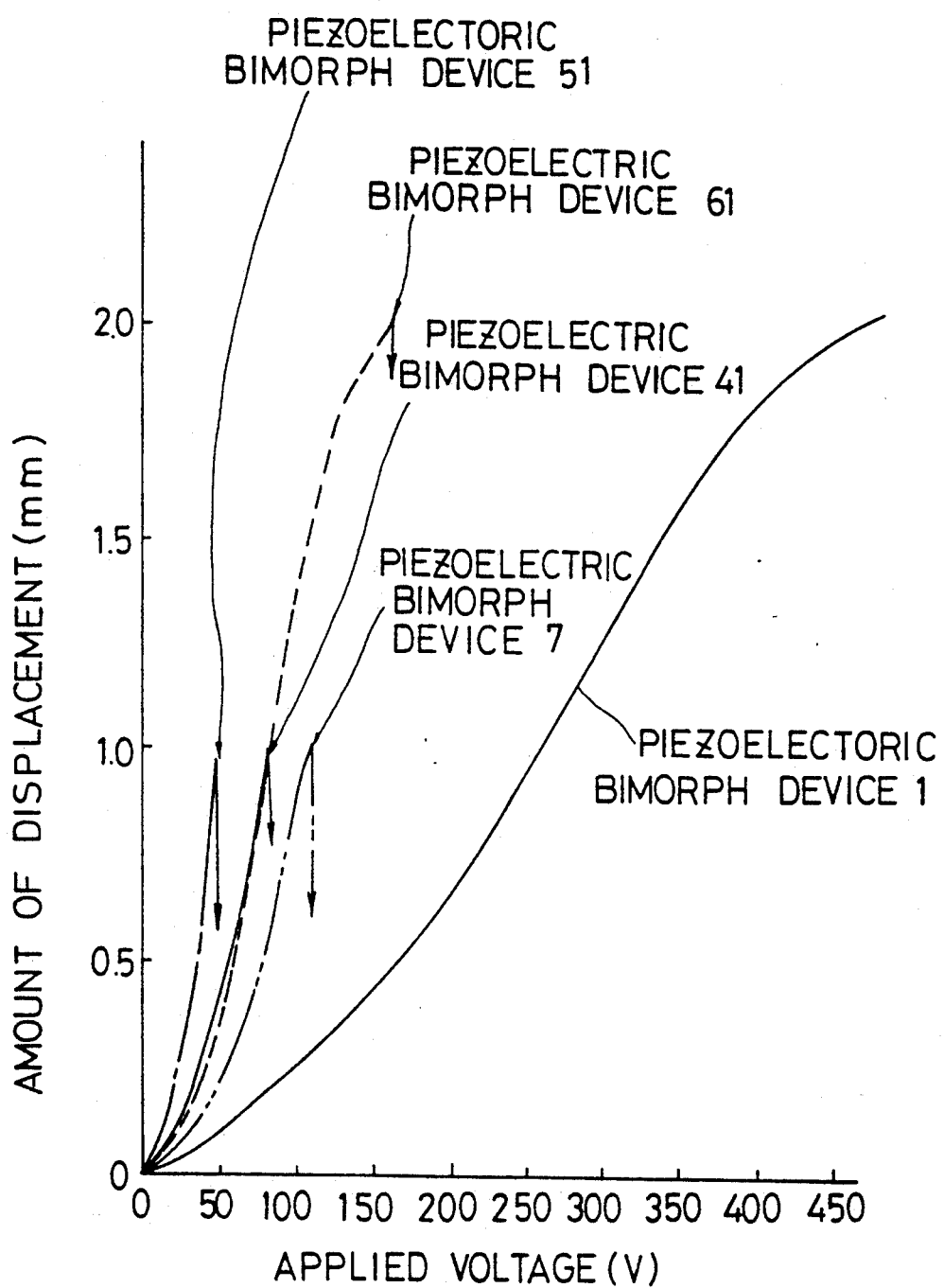
FIG. 12 is a diagram showing the relations between the amount of displacement and an applied voltage in the embodiments and the conventional example.

The relations between the amounts of displacement of the piezoelectric bimorph devices 41, 51 and 61 shown in FIGS. 9 to 11 constructed in the above described manner and the applied voltage are shown in FIG. 12. In FIG. 12, a thick solid line, a thin line, and a one-dot and dash line respectively indicate the characteristics of the piezoelectric bimorph device 61 according to a fourth embodiment of the present invention, the piezoelectric bimorph device 51 of a parallel type, and the three-terminal type piezoelectric bimorph device 41. Furthermore, for comparison, the characteristics of the conventional piezoelectric bimorph device 7 of a parallel type shown in FIG. 3 are indicated by a two-dot and dash line.

The piezoelectric bimorph devices prepared in measuring the characteristics are all 25 mm in length × 10 mm in width × 0.3 mm in thickness, and used as a piezoelectric material is one of $d_{31} = 250 \times 10^{-12}$ m/J.

As can be seen from FIG. 12, the piezoelectric bimorph device 61 belonging to a piezoelectric bimorph device of a series type can be driven by applying a very large voltage, so that the maximum amount of displacement is made approximately two times as large as those in the piezoelectric bimorph devices 41 and 51.

One example of a method of fabricating the above described piezoelectric bimorph device 61 will be described with reference to FIG. 13. A ceramic green sheet made of a piezoelectric material of a Pb(Zr, Ti)O$_3$ system having composition in the vicinity of the boundary of a morphotropic phase which is obtained by replacing Pb with a slight amount of Sr and adding a small amount of additives is produced by a Doctor blade process, and a conductive paste mainly composed of Ag-Pd is printed on the ceramic green sheet. The conductive paste is printed from one edge of the rectangular ceramic green sheet and so as not to lead to the other edge thereof.

Figure 13:
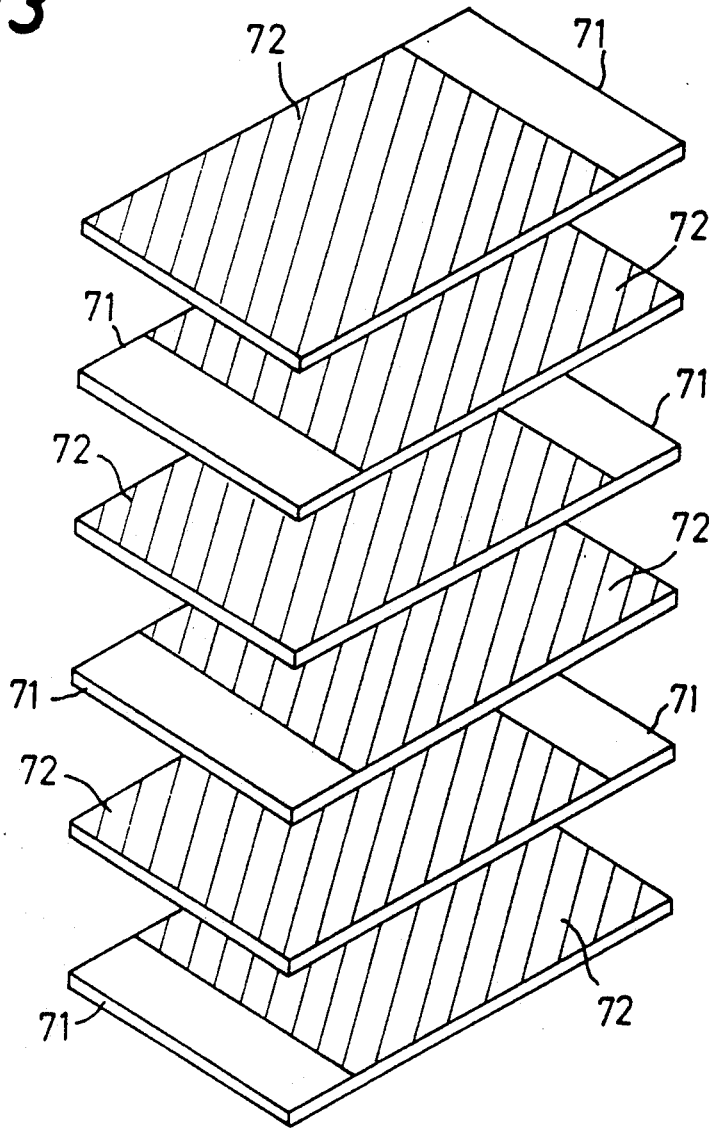
FIG. 13 is a perspective view for explaining the shapes of ceramic green sheets and conductive pastes formed thereon which are used in the fabrication of another embodiment of the monolithic piezoelectric bimorph device according to the present invention.

Ceramic green sheets respectively having conductive pastes printed thereon are laminated, as shown in FIG. 13. More specifically, six ceramic green sheets 71 are arranged such that the directions of conductive pastes 72 printed are alternately opposite to each other, and are laminated in the state. In the lowermost ceramic green sheet 71, the conductive paste 72 is also printed on the lower surface thereof.

The ceramic green sheets are bonded to each other by applying a pressure of 0.5 to 2 tons/cm$^2$ in the direction of thickness, and are held for several hours at a temperature of 1100° to 1250° C., followed by sintering. The size of the device after sintering is 0.3 mm in thickness, 10 mm in width and 40 mm in length.

Figure 14:
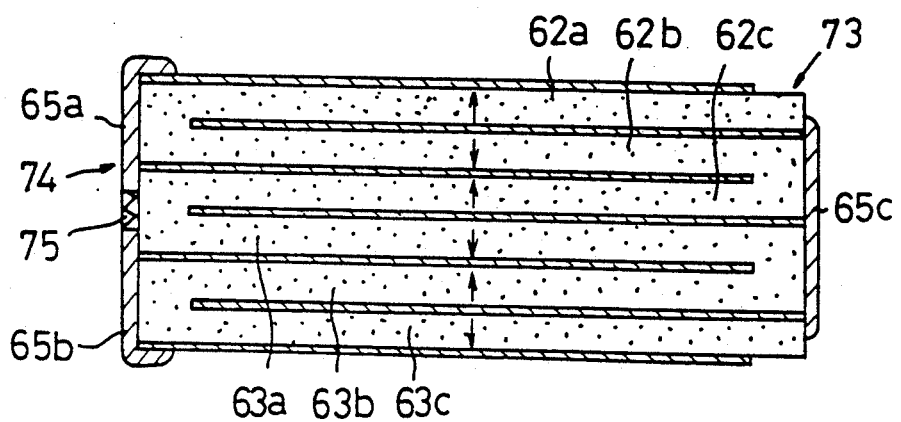
FIG. 14 is a cross sectional view for explaining the processes for fabricating the embodiment shown in FIG. 11.

As shown in FIG. 14, terminal electrodes 74 and 65c are then formed on both end surfaces of a sintered body 73 obtained, and a voltage of 50 to 250 V is applied between the terminal electrodes 74 and 65c, thereby to subject each of piezoelectric ceramic layers 62a to 62c and 63a to 63c of the sintered body 73 to polarization processing in the directions indicated by arrows as shown. Then, a terminal electrode portion 75 cross-hatched in the center of one of the terminal electrodes 74 is removed to form terminal electrodes 65a and 65b. The piezoelectric bimorph device 61 shown in FIG. 11 is thus obtained.

MODIFIED EXAMPLE

Figure 15:
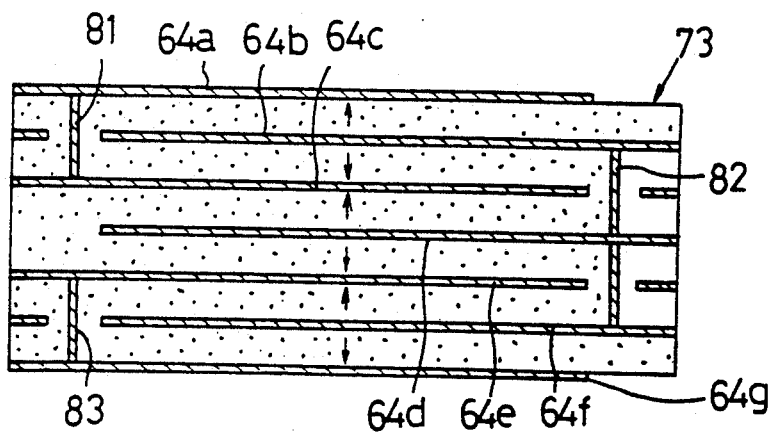
FIG. 15 is a schematic cross sectional view showing a monolithic piezoelectric bimorph device in a first modified example of the other embodiment of the piezoelectric bimorph device according to the present invention.

In the piezoelectric bimorph device 61 shown in FIG. 11, the electrodes 64a to 64g are electrically connected to each other by the terminal electrodes 65a to 65c formed in both ends of the sintered body 73. Alternatively, electrodes 64a to 64g may be similarly electrically connected to each other by through hole electrodes 81 to 83 constructed inside of a sintered body 73, as schematically shown in FIG. 15.

Furthermore, after electrodes 64a to 64g are formed so as to lead to both end surfaces 73a and 73b of the sintered body 73, insulators 84a to 84e such as glass may be applied to the end surfaces 73a and 73b so as to insulate the inner electrodes 64a to 64g and terminal electrodes 65a to 65c to which the inner electrodes must not be connected from each other. In this case, the terminal electrodes 65a to 65c are formed after the insulators 84a to 84e are applied.

Figure 17:
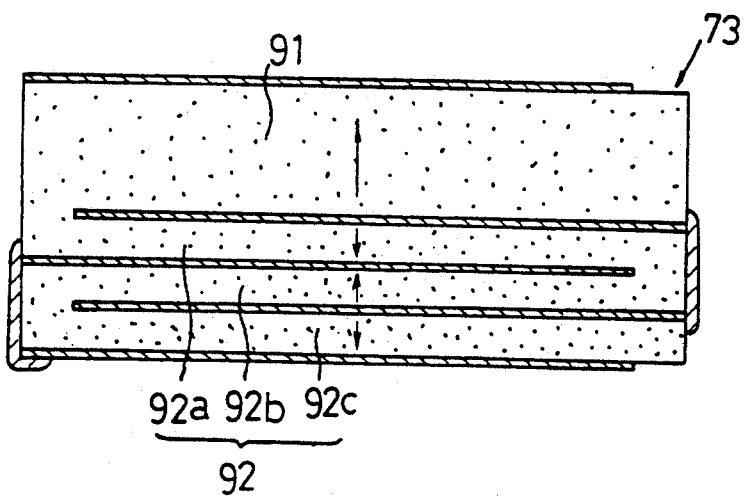
FIG. 17 is a schematic cross sectional view showing a monolithic piezoelectric bimorph device in a third modified example of the other embodiment of the piezoelectric bimorph device according to the present invention.

Although in the monolithic piezoelectric bimorph device 61 shown in FIG. 11, the first and second piezoelectric bodies 62 and 63 respectively comprise three piezoelectric ceramic layers, the piezoelectric bimorph device according to the present invention is not limited to one of such construction. For example, the piezoelectric bimorph device may be so constructed that a first piezoelectric body 91 comprises one piezoelectric ceramic layer and a second piezoelectric body 92 comprises three piezoelectric ceramic layers 92a to 92c in a sintered body 73, as shown in a schematic cross sectional view of FIG. 17.

Figure 18:
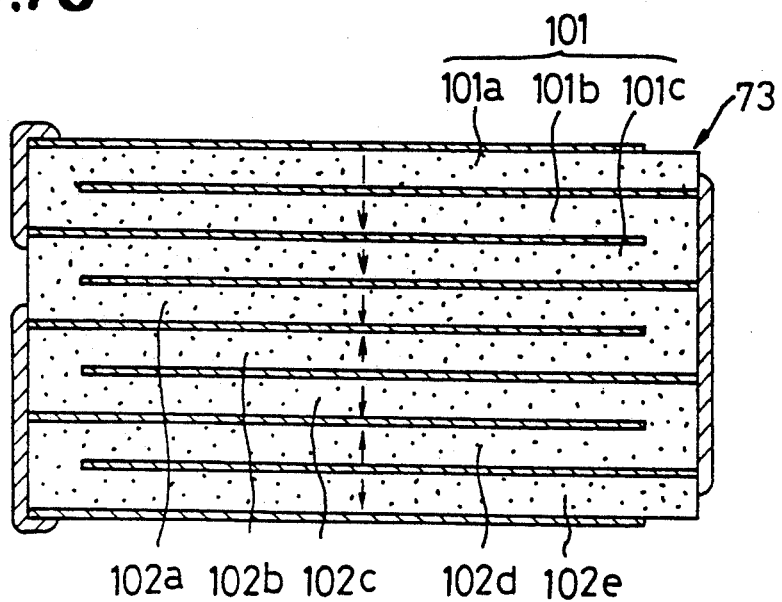
FIG. 18 is a schematic cross sectional view showing a monolithic piezoelectric bimorph device in a fourth modified example of the other embodiment of the piezoelectric bimorph device according to the present invention.

Similarly, the piezoelectric bimorph device may be so constructed that a first piezoelectric body 101 comprising three piezoelectric ceramic layers 101a to 101c and a second piezoelectric body 102 comprising five piezoelectric ceramic layers 102 to 102e are formed in a sintered body 73, as shown in a schematic cross sectional view of FIG. 18.

Figure 19:
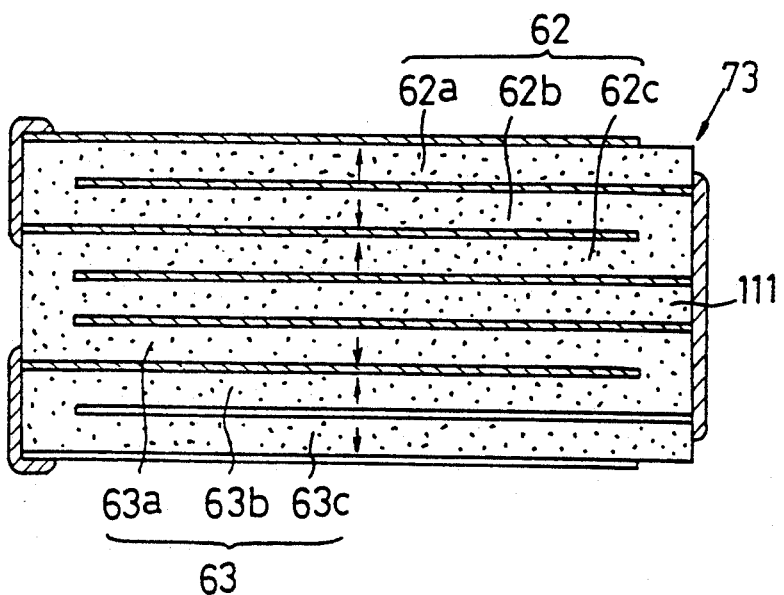
FIG. 19 is a schematic cross sectional view showing a monolithic piezoelectric bimorph device in a fifth modified example of the other embodiment of the piezoelectric bimorph device according to the present invention.

Furthermore, the piezoelectric bimorph device according to the present invention need not be so constructed that the first and second piezoelectric bodies are directly laminated, unlike the above described examples of construction. For example, a ceramic layer 111 which is not subjected to polarization processing may be provided between a first piezoelectric body 62 and a second piezoelectric body 63, as shown in FIG. 19. In this case, it is preferable that the upper and lower surfaces of the ceramic layer 111 are electrically connected to the same potential.

The above described monolithic piezoelectric bimorph devices in the embodiments and the modified examples are constructed by using the sintered body 73 obtained by laminating a plurality of ceramic green sheets, followed by cofiring. The monolithic piezoelectric bimorph device according to the present invention can be fabricated by separately fabricating first and second piezoelectric bodies and affixing the piezoelectric bodies to each other.

Figure 16:
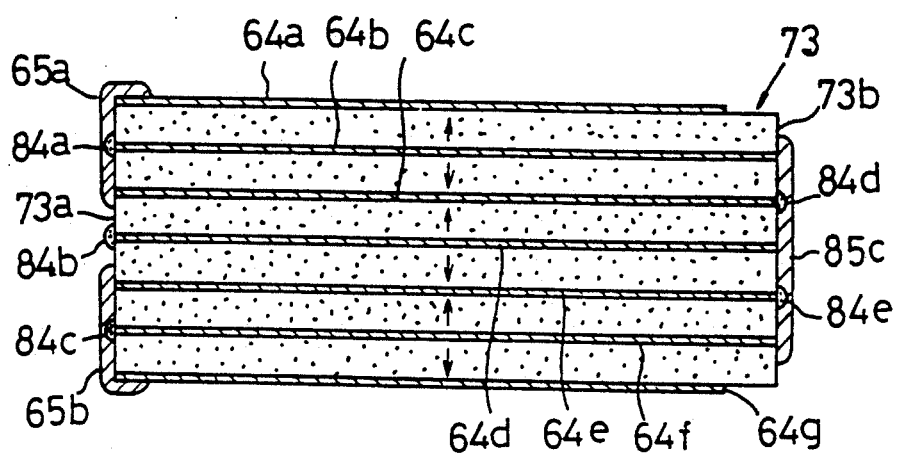
FIG. 16 is a schematic cross sectional view showing a monolithic piezoelectric bimorph device in a second modified example of the other embodiment of the piezoelectric bimorph device according to the present invention.
Figure 20:
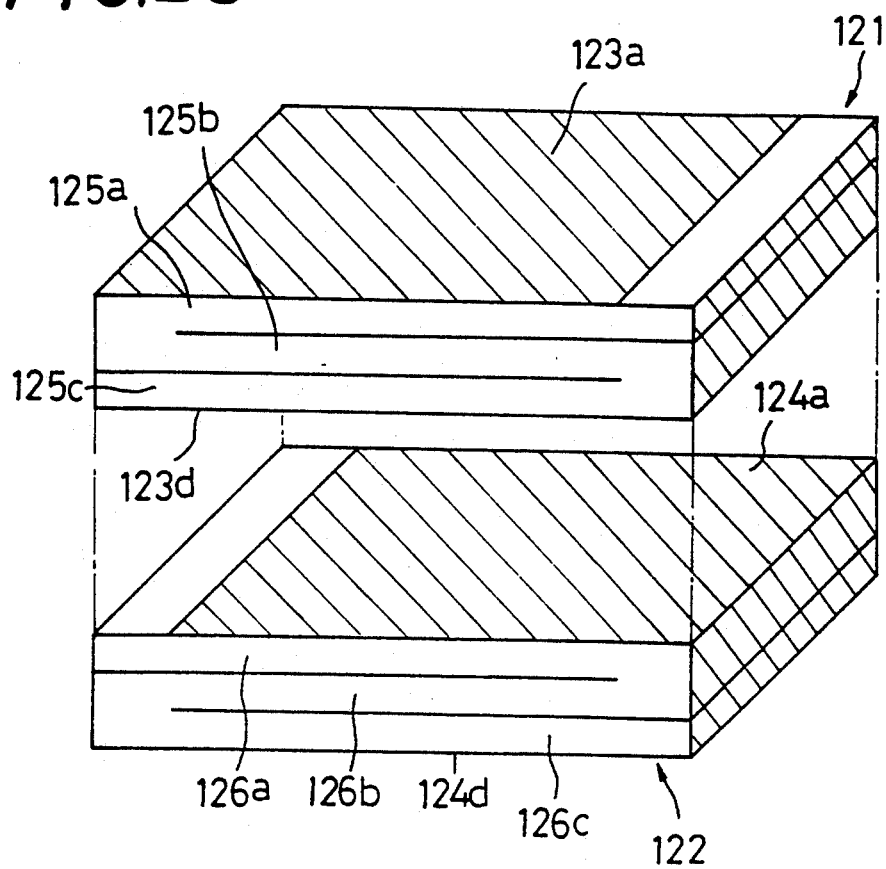
FIG. 20 is a perspective view showing the processes for fabricating a monolithic piezoelectric bimorph device constructed by separately affixing first and second piezoelectric bodies.
Figure 21:
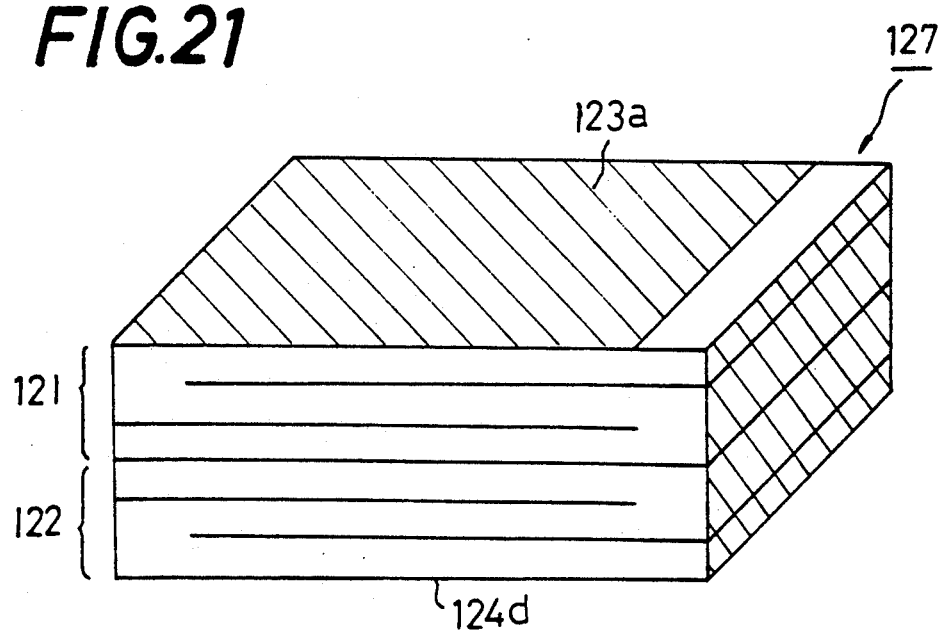
FIG. 21 is a perspective view showing a modified example of the piezoelectric bimorph device according to the embodiment shown in FIG. 11.

For example, as shown in FIG. 20, a first monolithic piezoelectric body 121 and a second monolithic piezoelectric body 122 obtained in the same method as that for obtaining the piezoelectric bimorph device shown in FIG. 16 are separately fabricated, a voltage is applied between respective outermost electrodes 123a and 123d and 124a and 124d of the monolithic piezoelectric bodies 121 and 122 to subject respective piezoelectric ceramic layers 125a to 125c and 126a to 126c in the piezoelectric bodies 121 and 122 to polarization processing and then, the first and second monolithic piezoelectric bodies 121 and 122 are affixed to each other using epoxy adhesives, thereby to make it possible to obtain a monolithic piezoelectric bimorph device 127, as shown in FIG. 21.

Figure 22:
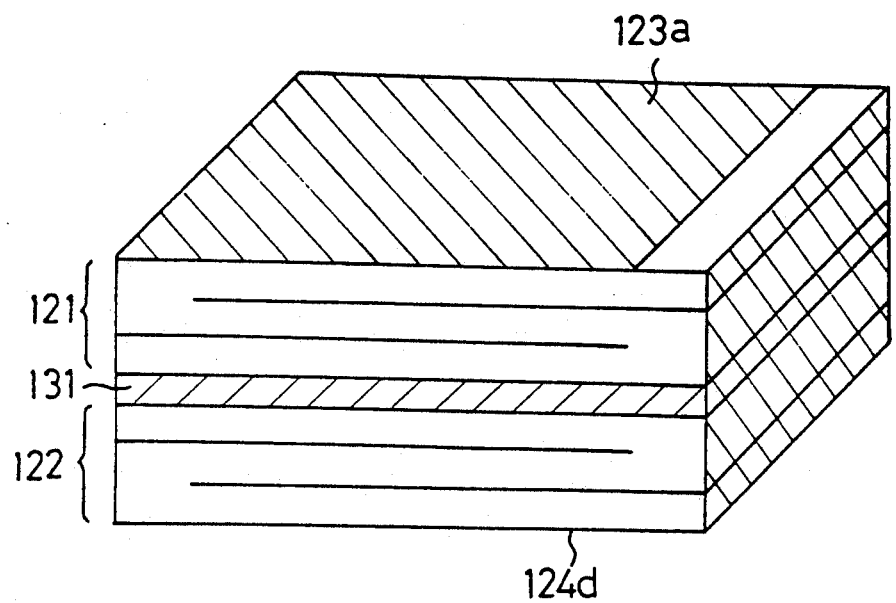
FIG. 22 is a perspective view showing another modified example of the piezoelectric bimorph device according to the embodiment shown in FIG. 11.
Figure 23:
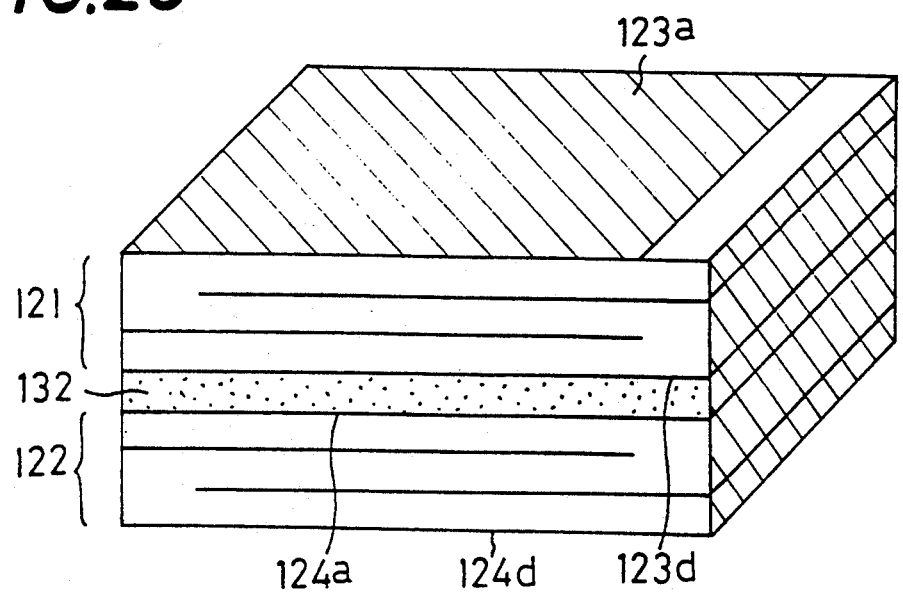
FIG. 23 is a perspective view showing still another modified example of the piezoelectric bimorph device according to the embodiment shown in FIG. 11.

Furthermore, the first and second monolithic piezoelectric bodies 121 and 122 may be affixed to each other through a metal plate 131 made of a Shim material or the like, as shown in FIG. 22, or the first and second piezoelectric bodies 121 and 122 may be affixed to each other through a plate-shaped body 132 made of an insulating material, as shown in FIG. 23. Used as the above described plate-shaped body 132 made of an insulating material is one made of insulating ceramics such as zirconia.

Additionally, although in the above described modified examples shown with reference to FIGS. 20 to 23, first and second piezoelectric bodies are obtained by the cofiring method and then, are affixed to each other to construct a monolithic piezoelectric bimorph device, piezoelectric ceramic plates separately sintered may be respectively used as respective piezoelectric ceramic layers in the first and second piezoelectric bodies and all affixed to each other to construct a monolithic piezoelectric bimorph device.

Moreover, the piezoelectric bimorph device according to the present invention can be obtained by controlling, for example, the direction of orientation of an oriented film made of ZnO or the like under conditions of film formation using sputtering or the like.

The piezoelectric body used in the present invention is not limited to the above described one made of piezoelectric ceramics. For example, it may be one made of a single crystal. In addition, it is pointed that a polarization reversed layer made of $LiTaO_3$ or $LiNbO_3$ which is a piezoelectric single crystal may be utilized.

Although in the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of driving a piezoelectric bimorph device, which comprises the steps of:

preparing first and second piezoelectric bodies, each of said first and second piezoelectric bodies comprising at least one piezoelectric layer;

electrically connecting said first and second piezoelectric bodies in series, so that they expand or contract in opposite directions, to obtain said piezoelectric bimorph device; and applying a voltage of not less than $(V_1+V_2)$ to said piezoelectric bimorph device, wherein:

a first piezoelectric layer comprised in one of said first and second piezoelectric bodies has a thickness $t_1$, a piezoelectric material included in said first piezoelectric layer has a coercive field strength of Ec, and $V_1$ has a minimum value equal to the product $Ec \times t_1 = Vc_1$; and a second piezoelectric layer comprised in the other piezoelectric body has a thickness $t_2$, a piezoelectric material included in said second piezoelectric layer also has said coercive field strength of Ec, and $V_2$ has a minimum value equal to the product $Ec \times t_2 = Vc_2$;

wherein $Vc_1$ and $Vc_2$ are coercive voltages for said first and second piezoelectric layers, respectively.

2. The method of driving a piezoelectric bimorph device according to claim 1, wherein said step of preparing said first and second piezoelectric bodies comprises the step of preparing said first and second piezoelectric bodies from single piezoelectric layers, respectively.

3. The method of driving a piezoelectric bimorph device according to claim 2, wherein said step of preparing said first and second piezoelectric bodies comprises the step of laminating said first and second piezoelectric bodies while separating said first and second piezoelectric bodies by a plate-shaped member.

4. The method of driving a piezoelectric bimorph device according to claim 3, wherein said step of laminating said first and second piezoelectric bodies comprises the step of separating said first and second piezoelectric bodies by a metal plate.

5. The method of driving a piezoelectric bimorph device according to claim 3, wherein said step of laminating said first and second piezoelectric bodies comprises the step of separating said first and second piezoelectric bodies by a ceramics plate-shaped member which is not subjected to polarization processing.

6. The method of driving a piezoelectric bimorph device according to claim 1, wherein said step of preparing said first and second piezoelectric bodies comprises laminating piezoelectric layers to obtain respective laminated piezoelectric layers; each laminated piezoelectric layer comprising a plurality of piezoelectric layers.

7. The method of driving a piezoelectric bimorph device according to claim 1, wherein said step of preparing said first and second piezoelectric bodies comprises preparing one of said first and second piezoelectric bodies from at least one piezoelectric layer and the other of said piezoelectric bodies from a laminated piezoelectric layer obtained by laminating not less than two piezoelectric layers; and the step of subjecting to polarization processing said piezoelectric layers in said laminated piezoelectric layer and electrically connecting said piezoelectric layers subjected to polarization processing to each other so that they expand or contract in the same direction.

8. The method of driving a piezoelectric bimorph device according to claim 1, wherein said step of preparing said first and second piezoelectric bodies comprises the step of preparing both said first and second piezoelectric bodies, respectively, from laminated piezoelectric layers by laminating not less than two piezoelectric layers, said piezoelectric layers in each of said laminated piezoelectric layers being subjected to polarization processing and being electrically connected to each other so as to expand or contract in the same direction.

9. The method of driving a piezoelectric bimorph device according to claim 8, wherein said step of preparing said first and second piezoelectric bodies comprises the step of forming a plurality of terminal electrodes on outer surfaces of a laminated body; said laminated body being obtained by laminating said first and second piezoelectric bodies; and said step of electrically connecting said piezoelectric bodies comprises the step of electrically connecting said plurality of terminal electrodes to said piezoelectric layers such that the first and second piezoelectric bodies can be driven through the plurality of terminal electrodes.

10. The method of driving a piezoelectric bimorph device according to claim 8, wherein said step of preparing said first and second piezoelectric bodies comprises the step of forming a plurality of through hole electrodes in a laminated body; said laminated body being obtained by laminating said first and second piezoelectric bodies; and said step of electrically connecting said piezoelectric bodies comprises the step of electrically connecting said piezoelectric layers to each other by the through hole electrodes.

11. The method of driving a piezoelectric bimorph device according to claim 7, wherein said step of preparing said first and second piezoelectric bodies comprises the step of laminating said first and second piezoelectric bodies and the step of sintering said first and second piezoelectric bodies to obtain a cofired type sintered body.

12. The piezoelectric bimorph device according to claim 7, wherein said first piezoelectric body comprises a single piezoelectric ceramic layer, and the second piezoelectric body comprises a plurality of piezoelectric ceramic layers.

13. The method of driving a piezoelectric bimorph device according to claim 1, wherein said step of preparing said first and second piezoelectric bodies comprises the step of directly laminating said piezoelectric bodies.

14. The method of driving a piezoelectric bimorph device according to claim 1, wherein said step of preparing said first and second piezoelectric bodies comprises the step of indirectly laminating said piezoelectric bodies.

15. The method of driving a piezoelectric bimorph device according to claim 1, wherein said step of preparing said first and second piezoelectric bodies comprises the step of providing a laminated piezoelectric layer by laminating not fewer than two piezoelectric layers which have been subjected to polarization processing, and the step of electrically connecting said two piezoelectric layers to each other so that they expand or contract in the same direction.

16. The method of driving a piezoelectric bimorph device according to claim 1, wherein said step of preparing first and second piezoelectric bodies comprises the step of polarizing said piezoelectric layer in a polarization direction; and said step of applying a voltage comprises applying said voltage irrespective of said polarization direction of said respective piezoelectric bodies.

* * * * *